(12) United States Patent
Du

(10) Patent No.: US 11,367,852 B2
(45) Date of Patent: Jun. 21, 2022

(54) MANUFACTURING METHOD OF OLED DISPLAY PANEL WITH CATHODE METAL LAYER OF LOWER CONDUCTIVITY AND OLED DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Zhonghui Du, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 51 days.

(21) Appl. No.: 17/047,474

(22) PCT Filed: Sep. 4, 2020

(86) PCT No.: PCT/CN2020/113589
§ 371 (c)(1),
(2) Date: Oct. 14, 2020

(87) PCT Pub. No.: WO2022/027764
PCT Pub. Date: Feb. 10, 2022

(65) Prior Publication Data
US 2022/0045298 A1    Feb. 10, 2022

(30) Foreign Application Priority Data
Aug. 7, 2020  (CN) .................. 202010786585.X

(51) Int. Cl.
*H01L 29/08*    (2006.01)
*H01L 51/52*    (2006.01)
(Continued)

(52) U.S. Cl.
CPC ...... *H01L 51/5221* (2013.01); *H01L 27/3246* (2013.01); *H01L 51/001* (2013.01);
(Continued)

(58) Field of Classification Search
CPC ............ H01L 51/5221; H01L 51/0012; H01L 51/5056; H01L 27/3246
(Continued)

(56) References Cited

U.S. PATENT DOCUMENTS

2005/0142974 A1   6/2005  Lee et al.
2009/0061720 A1   3/2009  Fujimaki
(Continued)

FOREIGN PATENT DOCUMENTS

CN   100456526 C   1/2009
CN   103650067 A   3/2014
(Continued)

*Primary Examiner* — Phuc T Dang
(74) *Attorney, Agent, or Firm* — The Roy Gross Law Firm, LLC; Roy Gross

(57) ABSTRACT

The manufacturing method provided by this application comprises: providing a substrate on which a plurality of pixel defining layers are arranged at intervals; disposing a hole injection layer on the substrate; disposing a hole transport layer on the hole injection layer; disposing an organic light emitting layer on the hole transport layer; disposing an electron transport layer on the organic light emitting layer and the pixel defining layers; and disposing a cathode metal layer on the electron transport layer, wherein the cathode metal layer comprises a first area located above the pixel defining layers; and processing the cathode metal layer in the first area.

16 Claims, 3 Drawing Sheets

(51) Int. Cl.
*H01L 27/32* (2006.01)
*H01L 51/00* (2006.01)
*H01L 51/56* (2006.01)
*H01L 51/50* (2006.01)

(52) U.S. Cl.
CPC ...... *H01L 51/0005* (2013.01); *H01L 51/0021* (2013.01); *H01L 51/5012* (2013.01); *H01L 51/5056* (2013.01); *H01L 51/5072* (2013.01); *H01L 51/5088* (2013.01); *H01L 51/5206* (2013.01); *H01L 51/56* (2013.01)

(58) Field of Classification Search
USPC .......................................................... 257/40
See application file for complete search history.

(56) References Cited

U.S. PATENT DOCUMENTS

| | | | |
|---|---|---|---|
| 2014/0120027 A1 | 5/2014 | Tanabe et al. | |
| 2016/0163992 A1* | 6/2016 | Bae | H01L 51/0058 257/40 |
| 2016/0276617 A1* | 9/2016 | Qi | H01L 51/5284 |
| 2018/0241009 A1* | 8/2018 | Liu | H01L 27/3283 |
| 2019/0013370 A1* | 1/2019 | Nie | H01L 51/525 |
| 2019/0198807 A1* | 6/2019 | Liu | C08J 7/042 |
| 2020/0194732 A1 | 6/2020 | Yao et al. | |
| 2020/0280009 A1* | 9/2020 | Lin | H01L 51/5012 |
| 2020/0348782 A1 | 11/2020 | Moon et al. | |

FOREIGN PATENT DOCUMENTS

| | | |
|---|---|---|
| CN | 108255347 A | 7/2018 |
| CN | 109524576 A | 3/2019 |

\* cited by examiner

MANUFACTURING METHOD OF OLED DISPLAY PANEL WITH CATHODE METAL LAYER OF LOWER CONDUCTIVITY AND OLED DISPLAY PANEL

BACKGROUND OF INVENTION

Field of Invention

The present application relates to the field of display technology, in particular to a manufacturing method of an OLED display panel and the OLED display panel.

Description of Prior Art

Organic light emitting diode (OLED) devices have become the most promising new display device in recent years due to their self-luminous, all-solid-state, and high-contrast advantages. At present, a current application direction of OLED comprises side by side RGB OLED technology and white OLED+CF technology. Such products are mainly divided into small-sized mobile phones, pad screens, and larger-sized TV screens. In a direction of large-sized OLED applications, products on the market are centered around a bottom light-emitting structure, wherein a cathode uses a thicker metal layer. However, with an increase in resolution, bottom OLED will be limited by aperture ratio, making it difficult to achieve high resolution. Hence, more and more practitioners are turning their energy to development of top OLED, hoping to achieve higher resolution.

R/G/B OLED devices prepared by inkjet printing technology are prone to leakage current.

SUMMARY OF INVENTION

The purpose of an embodiment of the present application is to provide a manufacturing method of an OLED display panel and the OLED display panel, which can reduce leakage current, prevent the resolution of the OLED display panel from being limited by the aperture ratio, and can improve the resolution of the OLED display panel.

In a first aspect, the embodiment of the present application provides a manufacturing method of an OLED display panel, comprising following steps:

providing a substrate on which a plurality of pixel defining layers are arranged at intervals;

disposing a hole injection layer on the substrate, wherein the hole injection layer is arranged in gaps between the plurality of pixel defining layers;

disposing a hole transport layer on the hole injection layer;

disposing an organic light emitting layer on the hole transport layer;

disposing an electron transport layer on the organic light emitting layer and the pixel defining layers;

disposing a cathode metal layer on the electron transport layer, wherein the cathode metal layer comprises a first area located above the pixel defining layers and a second area located above the organic light emitting layer; and processing the cathode metal layer in the first area to reduce a conductivity of a cathode transport layer in the first area;

wherein the step of disposing the electron transport layer on the organic light emitting layer and the pixel defining layers comprises:

disposing the electron transport layer on the organic light emitting layer and the pixel defining layers by performing a vacuum evaporation process; and wherein the step of disposing the cathode metal layer on the electron transport layer comprises:

disposing the cathode metal layer on the electron transport layer by performing the vacuum evaporation process.

In the manufacturing method of the OLED display panel described in the embodiment of the present application, the step of processing the cathode metal layer in the first area to reduce the conductivity of the cathode transport layer in the first area comprises:

using ultraviolet light to irradiate the cathode transport layer in the first area to reduce the conductivity of the cathode metal layer in the first area.

In the manufacturing method of the OLED display panel described in the embodiment of the present application, illuminance of the ultraviolet light is 10-60 w/cm2.

In the manufacturing method of the OLED display panel described in the embodiment of the present application, a laser is used to irradiate the cathode transport layer in the first area to reduce the conductivity of the cathode metal layer in the first area.

In the manufacturing method of the OLED display panel described in the embodiment of the present application, the step of processing the cathode metal layer in the first area to reduce the conductivity of the cathode transport layer in the first area comprises:

providing a light-shielding plate, wherein the light-shielding plate comprises a light-transmissive area, and shape parameters and size parameters of the light-transmissive area are same as shape parameters and size parameters of the first area; and arranging the light-shielding plate on the cathode metal layer to conduct ultraviolet light irradiation, so as to reduce the conductivity of the cathode metal layer in the first area.

In the manufacturing method of the OLED display panel described in the embodiment of the present application, the step of disposing the hole injection layer on the substrate between the plurality of pixel defining layers comprises:

disposing the hole injection layer between the plurality of pixel defining layers on the substrate by inkjet printing.

In a second aspect, the embodiment of the present application provides a manufacturing method of an OLED display panel, comprising following steps:

providing a substrate on which a plurality of pixel defining layers are arranged at intervals;

disposing a hole injection layer on the substrate, wherein the hole injection layer is arranged in gaps between the plurality of pixel defining layers;

disposing a hole transport layer on the hole injection layer;

disposing an organic light emitting layer on the hole transport layer;

disposing an electron transport layer on the organic light emitting layer and the pixel defining layers;

disposing a cathode metal layer on the electron transport layer, wherein the cathode metal layer comprises a first area located above the pixel defining layers and a second area located above the organic light emitting layer; and processing the cathode metal layer in the first area to reduce a conductivity of a cathode transport layer in the first area.

In the manufacturing method of the OLED display panel described in the embodiment of the present application, the step of processing the cathode metal layer in the first area to reduce the conductivity of the cathode transport layer in the first area comprises:

using ultraviolet light to irradiate the cathode transport layer in the first area to reduce the conductivity of the cathode metal layer in the first area.

In the manufacturing method of the OLED display panel described in the embodiment of the present application, illuminance of the ultraviolet light is 10-60 w/cm2.

In the manufacturing method of the OLED display panel described in the embodiment of the present application, a laser is used to irradiate the cathode transport layer in the first area to reduce the conductivity of the cathode metal layer in the first area.

In the manufacturing method of the OLED display panel described in the embodiment of the present application, the step of processing the cathode metal layer in the first area to reduce the conductivity of the cathode transport layer in the first area comprises:

providing a light-shielding plate, wherein the light-shielding plate comprises a light-transmissive area, and shape parameters and size parameters of the light-transmissive area are same as shape parameters and size parameters of the first area; and arranging the light-shielding plate on the cathode metal layer to conduct ultraviolet light irradiation, so as to reduce the conductivity of the cathode metal layer in the first area.

In the manufacturing method of the OLED display panel described in the embodiment of the present application, the step of disposing the hole injection layer on the substrate between the plurality of pixel defining layers comprises:

disposing the hole injection layer between the plurality of pixel defining layers on the substrate by inkjet printing.

In the manufacturing method of the OLED display panel described in the embodiment of the present application, the step of disposing the electron transport layer on the organic light emitting layer and the pixel defining layers comprises:

disposing the electron transport layer on the organic light emitting layer and the pixel defining layers by performing a vacuum evaporation process.

In the manufacturing method of the OLED display panel described in the embodiment of the present application, the step of disposing the cathode metal layer on the electron transport layer comprises:

disposing the cathode metal layer on the electron transport layer by performing a vacuum evaporation process.

In a third aspect, the embodiment of the present application also provides an OLED display panel, comprising:

a substrate on which a plurality of pixel defining layers are arranged at intervals;

a hole injection layer, wherein the hole injection layer is disposed on the substrate and located in a gap between the plurality of pixel defining layers;

a hole transport layer disposed on the hole injection layer;

an organic light emitting layer disposed on the hole transport layer;

an electron transport layer disposed on the organic light emitting layer and the pixel defining layers; and a cathode metal layer, wherein the cathode metal layer comprises a first area located above the pixel defining layers and a second area located above the organic light emitting layer, and a conductivity of the cathode metal layer in the first area is processed to be lower than a conductivity of the cathode metal layer in the second area.

In the OLED display panel described in the embodiment of the present application, an anode metal layer is further disposed between the substrate and the hole injection layer.

It can be seen from the above that the embodiment of the present application provides a substrate on which a plurality of pixel defining layers are arranged at intervals; a hole injection layer is disposed on the substrate, wherein the hole injection layer is arranged in gaps between the plurality of pixel defining layers; a hole transport layer is disposed on the hole injection layer; an organic light emitting layer is disposed on the hole transport layer; an electron transport layer is disposed on the organic light emitting layer and the pixel defining layers; a cathode metal layer is disposed on the electron transport layer, wherein the cathode metal layer comprises a first area located above the pixel defining layers and a second area located above the organic light emitting layer; and the cathode metal layer is processed in the first area to reduce the conductivity of the cathode transport layer in the first area; thereby, leakage current is reduced, and the resolution of the OLED display panel is prevented from being limited by the aperture ratio, and the resolution of the OLED display panel can be improved.

BRIEF DESCRIPTION OF DRAWINGS

In order to more clearly explain the technical solutions in the embodiments of the present application, the following will briefly introduce the drawings required in the description of the embodiments. Obviously, the drawings in the following description are only some embodiments of the present application. For those skilled in the art, without paying any creative work, other drawings can be obtained based on these drawings.

DETAILED DESCRIPTION OF PREFERRED EMBODIMENTS

Figure 1:
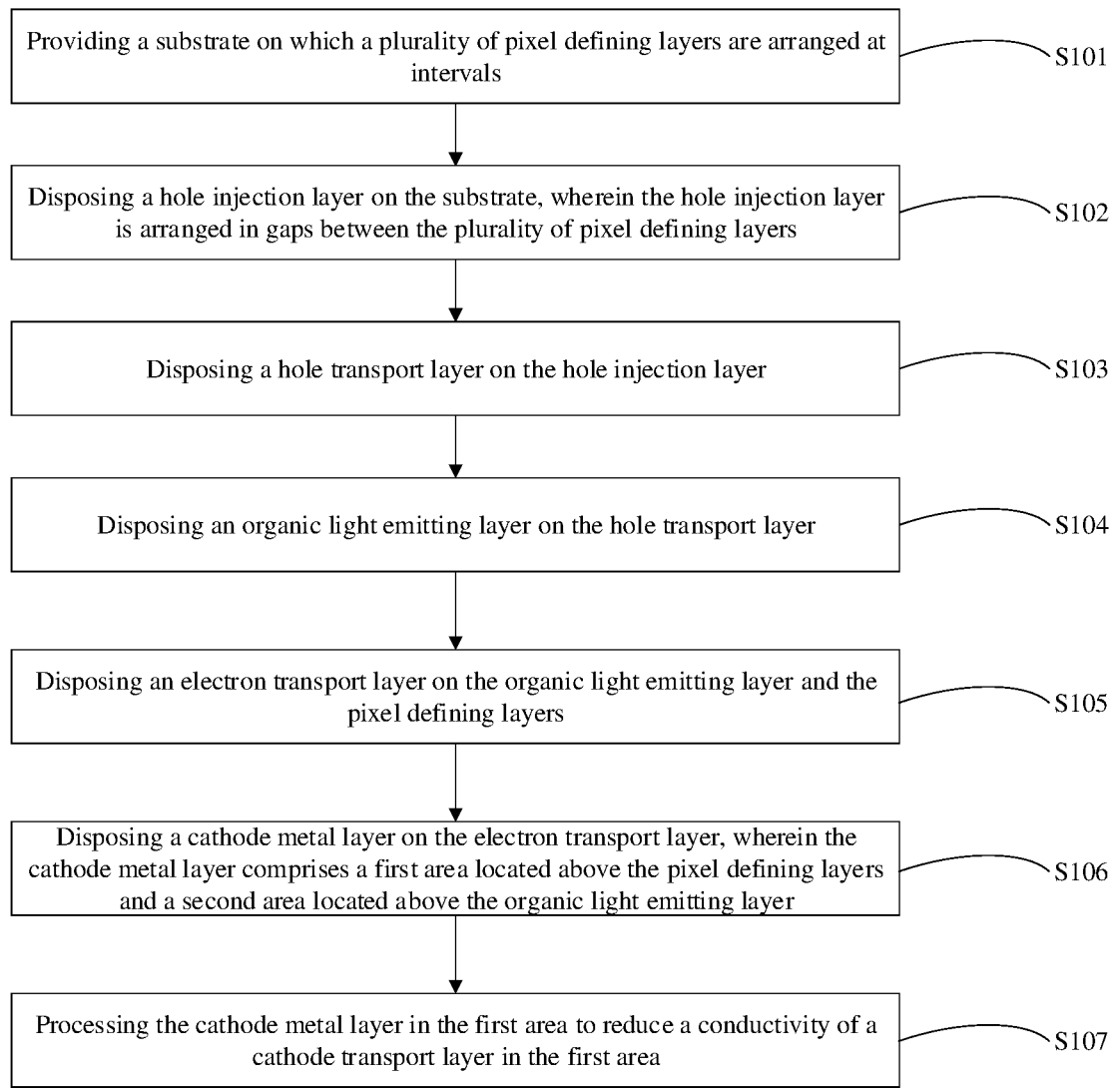
FIG. 1 is a flowchart of a manufacturing method of an OLED display panel provided by an embodiment of the application.

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

It should be noted that similar reference numerals and letters indicate similar items in the following drawings. Therefore, once an item is defined in one drawing, it does not need to be further defined and explained in the subsequent drawings. At the same time, in the description of this application, the terms "first", "second", etc. are only used to distinguish the description, and cannot be understood as indicating or implying relative importance.

Please refer to FIG. 1. FIG. 1 is a flowchart of a manufacturing method of an OLED display panel in some embodiments of the present application. The manufacturing method of the OLED display panel comprises the following steps:

S101. Providing a substrate on which a plurality of pixel defining layers are arranged at intervals.

S102. Disposing a hole injection layer on the substrate, wherein the hole injection layer is arranged in gaps between the plurality of pixel defining layers.

S103. Disposing a hole transport layer on the hole injection layer.

S104. Disposing an organic light emitting layer on the hole transport layer.

S105. Disposing an electron transport layer on the organic light emitting layer and the pixel defining layers.

S106. Disposing a cathode metal layer on the electron transport layer, wherein the cathode metal layer comprises a first area located above the pixel defining layers and a second area located above the organic light emitting layer.

S107. Processing the cathode metal layer in the first area to reduce a conductivity of a cathode transport layer in the first area.

Wherein, in the step S101, two pixel defining layers are provided at both ends above the substrate. The area formed by the two pixel defining layers and the substrate is a sub-pixel area. The pixel defining layers are divided into two types: lyophilic and lyophobic, and the material properties of the pixel defining layer will affect the film layer formed in the sub-pixel area. In the prior art, when the pixel defining layer is lyophilic, the material in the pixel defining layer is a lyophilic material. In the sub-pixel area, it is easy to form an organic film layer with a thick edge area and a thin middle area. When the pixel defining layer is lyophobic, the material of the pixel defining layer is lyophobic material, and it is easy to form a thin edge area and a thick middle area in the sub-pixel area. These two cases will cause uneven brightness.

Figure 2:
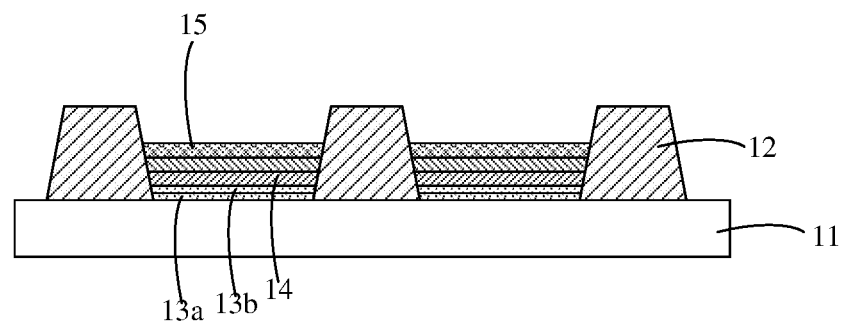
FIG. 2 to FIG. 4 are detailed schematic diagrams of the manufacturing method of the OLED display panel provided by an embodiment of the application.

As shown in FIG. 2, in the step S102, a hole injection layer 13a can be provided between the plurality of pixel defining layers 12 on the substrate 11 by inkjet printing.

As shown in FIG. 2, in the step S103, a hole transport layer 13b can be provided between the plurality of pixel defining layers 12 on the substrate 11 by inkjet printing. Of course, deposition can be used as a method to set the hole transport layer 13b.

As shown in FIG. 2, in the step S104, the organic light-emitting layer 14 comprises a plurality of organic light-emitting monomers. Generally, the organic light-emitting layers of the organic light-emitting layer 14 include green light-emitting monomers, blue light-emitting monomers, and red light-emitting monomers, wherein a green light-emitting monomer, a blue light-emitting monomer, and a red light-emitting monomer form a pixel unit.

As shown in FIG. 2, in the step S105, an electron transport layer 15 can be provided on the organic light-emitting layer and the pixel defining layer by using a vacuum evaporation process.

Figure 3:
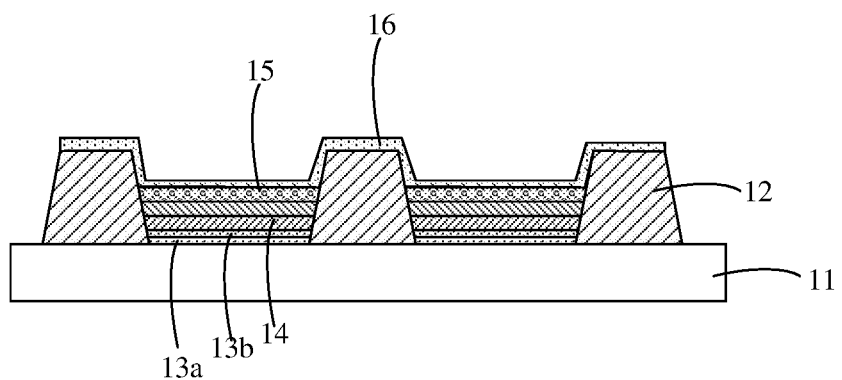

As shown in FIG. 3, in the step S106, a cathode metal layer 16 can be provided on the electron transport layer 15 by using a vacuum evaporation process.

Figure 4:
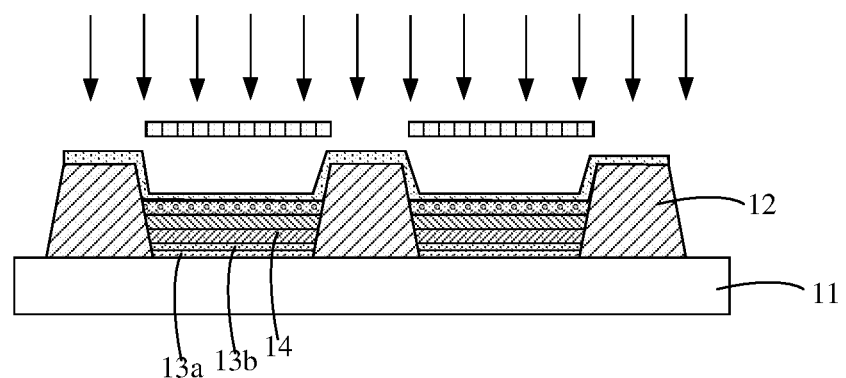

As shown in FIG. 4, in the step S107, ultraviolet light is used to irradiate the cathode transport layer in the first area to reduce the conductivity of the cathode metal layer in the first area. The illuminance of the ultraviolet light is 10-60 w/cm2. Or in other embodiments, laser is used to irradiate the cathode transport layer in the first area to reduce the conductivity of the cathode metal layer in the first area, thereby reducing leakage current and preventing the resolution of the OLED display panel from being limited by the opening rate.

In some embodiments, the step S107 comprises the following sub-steps: providing a light-shielding plate, wherein the light-shielding plate comprises a light-transmissive area, and shape parameters and size parameters of the light-transmissive area are the same as shape parameters and size parameters of the first area; arranging the light-shielding plate on the cathode metal layer for ultraviolet light irradiation, so as to reduce the conductivity of the cathode metal layer in the first area.

It can be seen from the above that the embodiment of the present application provides a substrate on which a plurality of pixel defining layers are arranged at intervals; a hole injection layer is disposed on the substrate, wherein the hole injection layer is arranged in gaps between the plurality of pixel defining layers; a hole transport layer is disposed on the hole injection layer; an organic light emitting layer is disposed on the hole transport layer; an electron transport layer is disposed on the organic light emitting layer and the pixel defining layers; a cathode metal layer is disposed on the electron transport layer, wherein the cathode metal layer comprises a first area located above the pixel defining layers and a second area located above the organic light emitting layer; and the cathode metal layer is processed in the first area to reduce the conductivity of the cathode transport layer in the first area; thereby, leakage current is reduced, and the resolution of the OLED display panel is prevented from being limited by the aperture ratio, and the resolution of the OLED display panel can be improved.

Figure 5:
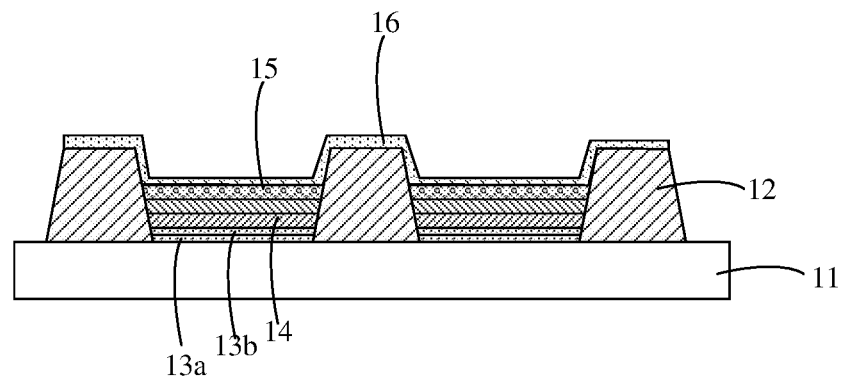
FIG. 5 is a schematic structural diagram of an OLED display panel provided by an embodiment of the application.

Please refer to FIG. 5, which is a schematic structural diagram of an OLED display panel in some embodiments of the present application. The OLED display panel comprises: a substrate 11 on which a plurality of pixel defining layers 12 are arranged at intervals; a hole injection layer 13a, the hole injection layer 13a is disposed on the substrate 11 and located in a gap between the plurality of pixel defining layers 12; a hole transport layer 13b disposed on the hole injection layer; an organic light emitting Layer 14 disposed on the hole transport layer; an electron transport layer 15 disposed on the organic light-emitting layer and the pixel defining layer; a cathode metal layer 16, the cathode metal layer comprises a first area above the pixel defining layers and a second area located above the organic light emitting layer; the conductivity of the cathode metal layer in the first area is processed to be lower than the conductivity of the cathode metal layer in the second area. Understandably, an anode metal layer is also provided between the substrate and the hole injection layer.

In the embodiments provided in this application, it should be understood that the disclosed apparatus and method may be implemented in other ways. The device embodiments described above are merely illustrative. For example, the division of the units is only a logical function division, and there may be other divisions in actual implementation. For example, multiple units or components may be combined or It can be integrated into another system, or some features can be ignored or not implemented. In addition, the displayed or discussed mutual coupling or direct coupling or communication connection may be indirect coupling or communication connection between devices or units through some communication interfaces, and may be in electrical, mechanical or other forms.

In addition, the units described as separate components may or may not be physically separate, and the components displayed as units may or may not be physical units, that is, they may be located in one place, or they may be distributed on multiple network units. Some or all of the units may be selected according to actual needs to achieve the objectives of the solutions of the embodiments.

Furthermore, the functional modules in the various embodiments of the present application may be integrated together to form an independent part, or each module may exist alone, or two or more modules may be integrated to form an independent part.

In this article, relational terms such as first and second are only used to distinguish one entity or operation from another entity or operation, and do not necessarily require or imply any such existence between these entities or operations. The actual relationship or order.

The above descriptions are only examples of the present application, and are not used to limit the protection scope of the present application. For those skilled in the art, the present application can have various modifications and changes. Any modification, equivalent replacement, improvement, etc. made within the spirit and principle of this application shall be included in the protection scope of this application.

What is claimed is:

1. A manufacturing method of an organic light emitting diode (OLED) display panel, comprising following steps:
   providing a substrate on which a plurality of pixel defining layers are arranged at intervals;
   disposing a hole injection layer on the substrate, wherein the hole injection layer is arranged in gaps between the plurality of pixel defining layers;
   disposing a hole transport layer on the hole injection layer;
   disposing an organic light emitting layer on the hole transport layer;
   disposing an electron transport layer on the organic light emitting layer and the pixel defining layers;
   disposing a cathode metal layer on the electron transport layer, wherein the cathode metal layer comprises a first area located above the pixel defining layers and a second area located above the organic light emitting layer; and
   processing the cathode metal layer in the first area to reduce a conductivity of a cathode transport layer in the first area;
   wherein the step of disposing the electron transport layer on the organic light emitting layer and the pixel defining layers comprises:
   disposing the electron transport layer on the organic light emitting layer and the pixel defining layers by performing a vacuum evaporation process; and
   wherein the step of disposing the cathode metal layer on the electron transport layer comprises:
   disposing the cathode metal layer on the electron transport layer by performing the vacuum evaporation process.

2. The manufacturing method of the OLED display panel of claim 1, wherein the step of processing the cathode metal layer in the first area to reduce the conductivity of the cathode transport layer in the first area comprises:
   using ultraviolet light to irradiate the cathode transport layer in the first area to reduce the conductivity of the cathode metal layer in the first area.

3. The manufacturing method of the OLED display panel of claim 2, wherein illuminance of the ultraviolet light is 10-60 w/cm2.

4. The manufacturing method of the OLED display panel of claim 1, wherein laser is used to irradiate the cathode transport layer in the first area to reduce the conductivity of the cathode metal layer in the first area.

5. The manufacturing method of the OLED display panel of claim 1, wherein the step of processing the cathode metal layer in the first area to reduce the conductivity of the cathode transport layer in the first area comprises:
   providing a light-shielding plate, wherein the light-shielding plate comprises a light-transmissive area, and shape parameters and size parameters of the light-transmissive area are same as shape parameters and size parameters of the first area; and
   arranging the light-shielding plate on the cathode metal layer to conduct ultraviolet light irradiation, so as to reduce the conductivity of the cathode metal layer in the first area.

6. The manufacturing method of the OLED display panel of claim 1, wherein the step of disposing the hole injection layer on the substrate between the plurality of pixel defining layers comprises:
   disposing the hole injection layer between the plurality of pixel defining layers on the substrate by inkjet printing.

7. A manufacturing method of an organic light emitting diode (OLED) display panel, comprising following steps:
   providing a substrate on which a plurality of pixel defining layers are arranged at intervals;
   disposing a hole injection layer on the substrate, wherein the hole injection layer is arranged in gaps between the plurality of pixel defining layers;
   disposing a hole transport layer on the hole injection layer;
   disposing an organic light emitting layer on the hole transport layer;
   disposing an electron transport layer on the organic light emitting layer and the pixel defining layers;
   disposing a cathode metal layer on the electron transport layer, wherein the cathode metal layer comprises a first area located above the pixel defining layers and a second area located above the organic light emitting layer; and
   processing the cathode metal layer in the first area to reduce a conductivity of a cathode transport layer in the first area.

8. The manufacturing method of the OLED display panel of claim 7, wherein the step of processing the cathode metal layer in the first area to reduce the conductivity of the cathode transport layer in the first area comprises:
   using ultraviolet light to irradiate the cathode transport layer in the first area to reduce the conductivity of the cathode metal layer in the first area.

9. The manufacturing method of the OLED display panel of claim 8, wherein illuminance of the ultraviolet light is 10-60 w/cm2.

10. The manufacturing method of the OLED display panel of claim 7, wherein laser is used to irradiate the cathode transport layer in the first area to reduce the conductivity of the cathode metal layer in the first area.

11. The manufacturing method of the OLED display panel of claim 7, wherein the step of processing the cathode metal layer in the first area to reduce the conductivity of the cathode transport layer in the first area comprises:
    providing a light-shielding plate, wherein the light-shielding plate comprises a light-transmissive area, and shape parameters and size parameters of the light-transmissive area are same as shape parameters and size parameters of the first area; and
    arranging the light-shielding plate on the cathode metal layer to conduct ultraviolet light irradiation, so as to reduce the conductivity of the cathode metal layer in the first area.

12. The manufacturing method of the OLED display panel of claim 7, wherein the step of disposing the hole injection layer on the substrate between the plurality of pixel defining layers comprises:

disposing the hole injection layer between the plurality of pixel defining layers on the substrate by inkjet printing.

13. The manufacturing method of the OLED display panel of claim 7, wherein the step of disposing the electron transport layer on the organic light emitting layer and the pixel defining layers comprises:

disposing the electron transport layer on the organic light emitting layer and the pixel defining layers by performing a vacuum evaporation process.

14. The manufacturing method of the OLED display panel of claim 7, wherein the step of disposing the cathode metal layer on the electron transport layer comprises:

disposing the cathode metal layer on the electron transport layer by performing a vacuum evaporation process.

15. An OLED display panel, comprising:

a substrate on which a plurality of pixel defining layers are arranged at intervals;

a hole injection layer, wherein the hole injection layer is disposed on the substrate and located in a gap between the plurality of pixel defining layers;

a hole transport layer disposed on the hole injection layer;

an organic light emitting layer disposed on the hole transport layer;

an electron transport layer disposed on the organic light emitting layer and the pixel defining layers; and a cathode metal layer, wherein the cathode metal layer comprises a first area located above the pixel defining layers and a second area located above the organic light emitting layer, and a conductivity of the cathode metal layer in the first area is processed to be lower than a conductivity of the cathode metal layer in the second area.

16. The OLED display panel of claim 15, wherein an anode metal layer is further disposed between the substrate and the hole injection layer.

* * * * *